(12) United States Patent
Care

(10) Patent No.: US 7,161,486 B2
(45) Date of Patent: Jan. 9, 2007

(54) ELECTROSTATIC SENSORS

(75) Inventor: Ian C D Care, Derby (GB)

(73) Assignee: Rolls-Royce plc, London (GB)

( * ) Notice: Subject to any disclaimer, the term of this patent is extended or adjusted under 35 U.S.C. 154(b) by 0 days.

(21) Appl. No.: 11/167,306

(22) Filed: Jun. 28, 2005

(65) Prior Publication Data
US 2005/0248335 A1    Nov. 10, 2005

(51) Int. Cl.
G08B 13/26    (2006.01)

(52) U.S. Cl. .................. 340/561; 324/109; 324/428

(58) Field of Classification Search ............... 340/561; 324/109, 458, 661; 250/208.1, 214.1; 382/312
See application file for complete search history.

(56) References Cited

U.S. PATENT DOCUMENTS

| 4,134,137 | A   |   | 1/1979 | Jacobs |
|-----------|-----|---|--------|--------|
| 4,679,068 | A   | * | 7/1987 | Lillquist et al. ............... 348/33 |
| 5,151,588 | A   | * | 9/1992 | Kiri et al. ................. 250/208.1 |
| 5,783,951 | A   | * | 7/1998 | Inoue et al. .................. 327/52 |
| 6,448,790 | B1  | * | 9/2002 | Imai ........................... 324/661 |
| 6,921,892 | B1  | * | 7/2005 | Colbeth et al. .......... 250/214.1 |
| 2003/0030443 | A1 | * | 2/2003 | Walker et al. .............. 324/458 |
| 2006/0034548 | A1 | * | 2/2006 | Pishdadian et al. ......... 382/312 |

FOREIGN PATENT DOCUMENTS

| DE | 3 807 355 A | 12/1988 |
| JP | 06 257 088 AB | 5/1996 |

* cited by examiner

Primary Examiner—Jeffery Hofsass
Assistant Examiner—Hoi C. Lau
(74) Attorney, Agent, or Firm—W. Warren Taltavull Manelli Dension & Selter PLLC

(57) ABSTRACT

A sensor 10 comprises an array of electrostatic sensor elements 12, each centred at a respective sensing position 14. Each element produces a respective output signal at 16. The outputs 16 can be used to drive respective pixels of a display. This allows an image to be created to represent the electrostatic charge distribution across the region to which the sensor is directed.

15 Claims, 3 Drawing Sheets

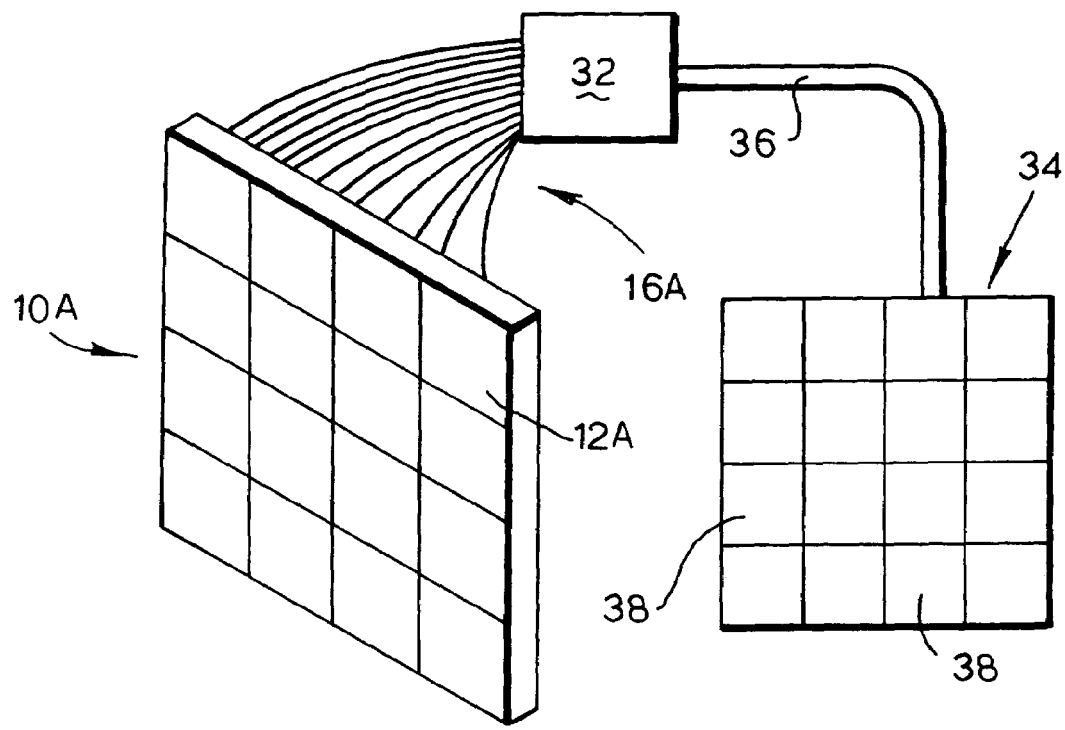
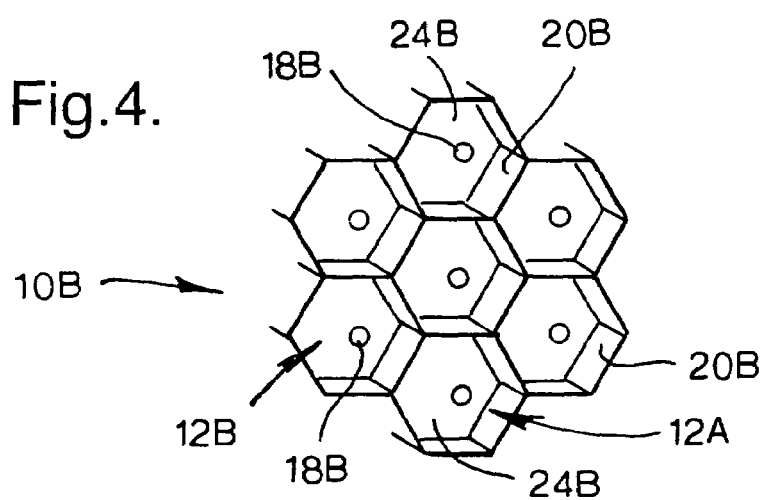

ELECTROSTATIC SENSORS

FIELD OF THE INVENTION

The present invention relates to electrostatic sensors.

BACKGROUND OF THE INVENTION

An electrostatic sensor is used to measure electrostatic charge, primarily by measuring the effect, on an electrode, of lines of flux emanating from the charge being measured. The sensing electrode is associated with an earthed shield and provides an output which depends on the magnitude of the charge being sensed. More particularly, the sensor output will usually be proportional to the magnitude of the charge in front of the sensing surface of the electrode, measured as a weighted average across the area of the surface. The degree of sensitivity is also related to the area of the sensing surface and the proximity of the earth shield. The field of view to which the sensor responds can be modified, for example by modifying the shape of the earth shield or by moving the sensor toward or away from the object of interest. A measurement made by the sensor at a particular point in time will represent the view of the sensor at that point in time. In the case of moving objects, a sequence of such measurements can be used to provide a more complete understanding of the system being observed, but this approach can give rise to problems, particularly with a fast moving or quickly changing system.

SUMMARY OF THE INVENTION

The present invention provides a sensor comprising an array of electrostatic sensor elements, each capable of producing a respective output signal when the sensor is directed to a region of an object being sensed, the output signals being separately available at the sensor output to provide information relating to the electrostatic charge distribution across the region.

Sensor elements may be located at sensing positions defined by a substantially regular matrix of positions. Sensor elements are preferably substantially contiguous across the array, to provide substantially continuous charge distribution information.

The sensor elements may form a substantially planar array.

Alternatively, the sensor elements may form a non-planar array. The non-planar form of the array may be such as to substantially conform to the surface of a predetermined region of an object. The array may be spherical or part-spherical, the sensor elements being arranged to sense outwardly of the sphere.

Preferably each sensor element incorporates a respective charge amplifier.

The sensor may further comprise a display means by means of which the output signals are displayed, in use, preferably in a manner which allows each output signal to be separately identified. The display means may provide an image having a plurality of pixels. Preferably, each pixel displays in response to a respective output signal. Alternatively, the display means may have a greater number of pixels than there are sensor elements, at least some pixel outputs being created with reference to a sensor element corresponding with a neighbouring pixel. The pixels may form an array laid out in the same manner as the corresponding sensor elements. In use, the display intensity of each pixel may be determined by the magnitude or polarity of the charge sensed by the corresponding sensor element. Alternatively or in addition, the display colour of each pixel may be determined, in use, by the polarity or magnitude of the charge sensed by the corresponding sensor element.

The display means and the array of elements are preferably incorporated within a common structure. Each sensor element may incorporate a display element which provides a pixel of the sensor display image.

BRIEF DESCRIPTION OF THE DRAWINGS

Examples of the present invention will now be described in more detail, by way of example only, and with reference to the accompanying drawings, in which:

FIG. 3 illustrates the manner of use of an array in accordance with the invention;

FIG. 4 illustrates in more detail, a simplified perspective view of part of an alternative sensor design in accordance with the invention;

DETAILED DESCRIPTION OF THE INVENTION

Figure 1:
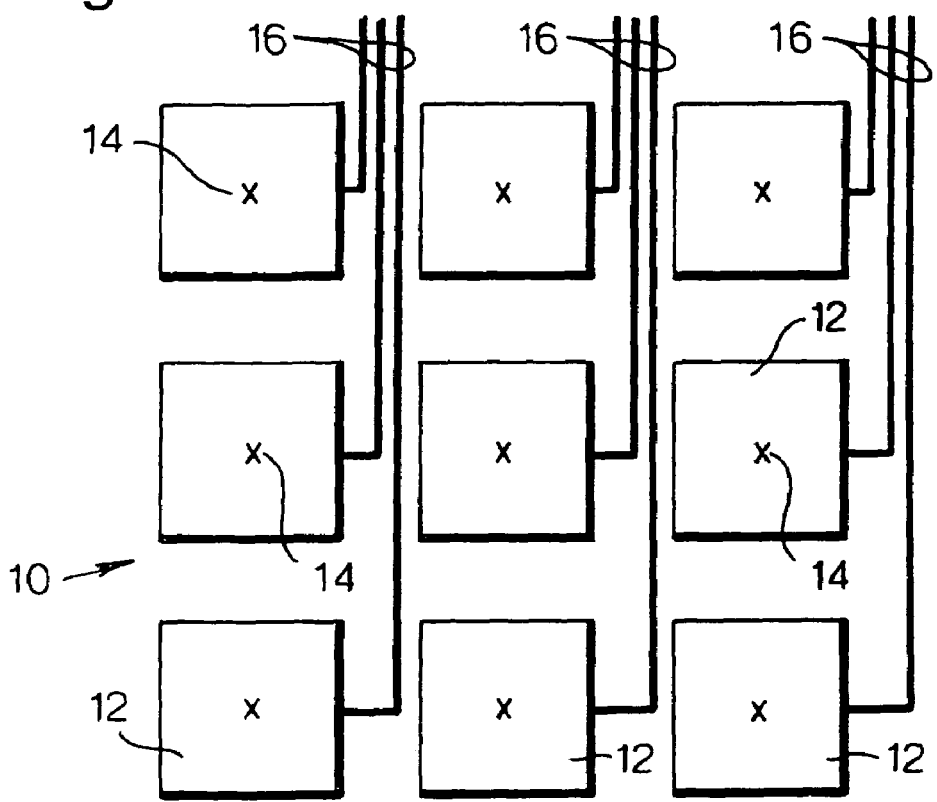
FIG. 1 schematically illustrates a first sensor in accordance with the present invention.

FIG. 1 shows a sensor 10 which comprises an array of electrostatic sensor elements 12. In this example, the array is a two-dimensional array of elements 12, each centred at a respective sensing position 14, indicated by small crosses in FIG. 1, the positions 14 forming a regular matrix of positions, illustrated as a square matrix.

Each element 12 is capable of producing a respective output signal, as will be described, when the sensor is directed to a region of an object being sensed. Output signals are provided by the elements 12 at outputs 16.

The outputs 16 (nine being shown in FIG. 1) together form the output of the sensor 10 and it is readily apparent from FIG. 1 that the output signals from each of the elements 12 is separately available at the sensor output. Thus, the output of each individual element 12 is available. Each element 12 is at a different position and thus will be differently sensing the object being sensed, for example sensing a slightly different location within the region being sensed. Consequently, consideration of the individual outputs 16 provides information relating to the electrostatic charge sensed across the array, and thus information relating to the electrostatic charge distribution across the region to which the sensor is directed.

Figure 2:
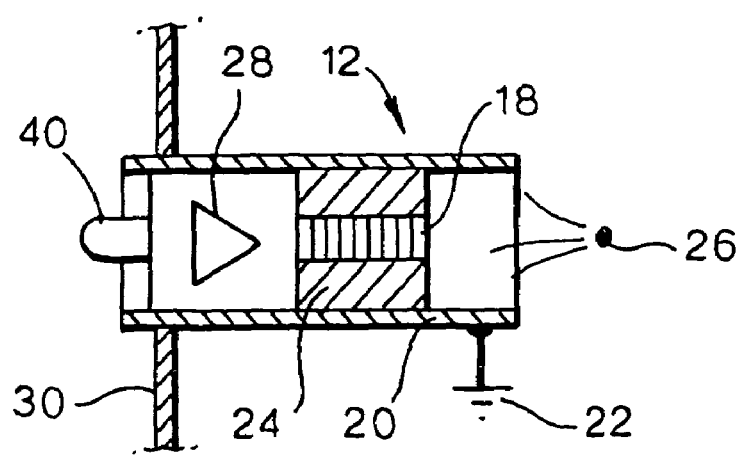
FIG. 2 is a schematic section through a sensor element of the arrangement of FIG. 1.

A single element 12 is illustrated in more detail in FIG. 2. The element 12 has a central electrode 18 surrounded by an earthed shield 20, in the form of a tube. The tube 20 is earthed as indicated at 22. The electrode 18 and tube 20 are separated by electrical insulator material 24.

The presence of an electrostatic charge, schematically illustrated at 26 will cause flux lines to emanate, including flux lines which interact with the electrode 18 and tube 20, to cause those integers to become charged. The magnitude of the induced charges will depend on the geometry of the arrangement, and the magnitude of the charge 26, as will be readily understood by the skilled reader. Furthermore, the polarity of the induced charged will depend on the polarity of the charge at 26.

When the element 12 is used for sensing, the charge induced on the electrode 18 and tube 20 is likely to be small in many practical situations and consequently, the element incorporates a charge amplifier illustrated schematically at 28. It is preferable to incorporate the charge amplifier within the element 12. This avoids the need for long connecting leads, which can give rise to spurious signals and noise.

In the example of FIG. 2, the element 12 is illustrated as mounted in a board 30, for reasons which will become apparent.

FIG. 3 illustrates one simplified example of an arrangement for making use of the outputs from the elements 12. In FIG. 3, sensor elements 12A form a sensor 10A. The outputs 16A of the elements 12A each connect with a signal processing arrangement at 32 which serves to pass information from the outputs 16A to a display 34, along a connection 36. The form of the connection 36 and the manner in which information is passed along it can be chosen from a wide variety of techniques and arrangements but it is important that whichever techniques and arrangements are chosen, the display 34 should receive, or be able to recover, information relating to each individual output 16A. These signals are then used to activate the pixels 38 of the display 34. In this example, the pixels 38 are laid out in the same manner and number as the sensor elements 12A and it is envisaged that this will often be desirable. This arrangement allows each output 16A to be applied to a single, respective pixel 38 at the position on the display 34 which corresponds with the position in the sensor 10A of the element 12A from which the output 16A was derived. Accordingly, the pixels 38 provide an image, visible to the eye, which represents the outputs 16A and thus provides a visual image representing the electrostatic charge distribution sensed by the elements 16A, across the region of the object to which the sensor has been directed. By virtue of the provision of an array of sensor elements 12A, this image can be created at the same time across the whole array of elements 12A, so that the resulting image indicates the electrostatic charge distribution across the region at a single point of time.

In an alternative, there may be a greater number of pixels 38 than there are elements 12A. Intermediate points in the display can then be created by reference to neighbouring pixels, by interpolation, "dither" or like techniques.

Although FIG. 3 envisages the output 16A being used to provide a visible and viewed image on the display 34, it is to be understood that the connection 36 could be used to convey corresponding information to a data processing system for analysis. In that case, no actual image would be created or viewed, but the data processing arrangement would be configured to consider the information as a representation of a complete image.

It can be seen from FIG. 3 that the square regions of the elements 12A are substantially contiguous, so that the areas of the sensor elements 12A cover substantially the whole area of the sensor 10A. Many alternative arrangements of contiguous sensor elements 12A could be devised. In some situations, it may not be necessary for the sensor elements 12A to be contiguous.

FIG. 4 illustrates an alternative arrangement in which contiguous sensor elements 12B of hexagonal shape are arrayed to form a sensor 10B. Each element 12B has a hexagonal earthed shield tube 20B which projects forward of the front face of an electrode 18B and insulator material 24B. This forward projection causes the element 12B to be influenced more strongly by electrostatic charge directly in front of it. The view of the element 12B is primarily directed forwardly. Thus, the array of elements 12B each looks primarily at a different position within the region being sensed and consequently, the outputs from the elements 12B, between them, provide information relating to the electrostatic charge distribution across that region.

The sensor of FIG. 4 can be connected to a display or data processing arrangement in the manner described above in relation to FIG. 3.

Returning to FIG. 2, the sensor element 12 is further shown as incorporating a display element 40, such as a light emitting diode (LED) or similar device. The element 40 is driven by the charge amplifier 28, or other signal processing circuit associated with the element 12, to create a visible display representing the output of the sensor element 12A. Consequently, the invention envisages mounting an array of sensor elements 12 in a common substrate or board 30, each with a display element 40, so that the face of the board 30, carrying the elements 12, can be pointed towards an object to be sensed, resulting in the array of elements 40, on the opposite face of the board 30, creating an image which is visible and which represents the electrostatic charge distribution across the region to which the sensor elements 12 have been directed. It is envisaged that this arrangement could form the basis of a hand-held device, or readily transportable device, which allows a human operator to be provided with a visual image representing electrostatic charge distribution, which is normally not visible to a human.

It is particularly envisaged that in any of the display arrangements, the intensity of the display element or pixel should be related to the magnitude of the charge being sensed by the corresponding display element, giving rise to an image reminiscent of a black and white photograph. In addition, it would be desirable for the polarity of the charge also to be displayed visually. This could be achieved by using respective colours for positive and negative charges, for example by using bi or tri-coloured LEDs.

Figure 5:
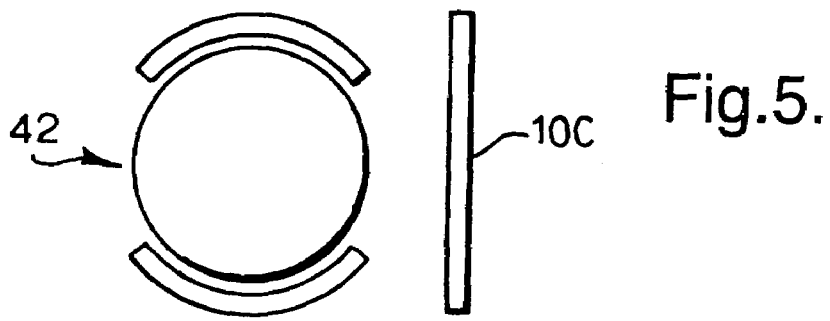
FIGS. 5, 6 and 7 are highly schematic diagrams of alternative applications of sensors in accordance with the invention.

FIG. 5 shows in simple schematic form a sensor 10C, of one of the types described above, being used alongside a bearing 42, for inspection purposes, for example. The output of the sensor elements of the sensor 10C may be used to drive display elements like the elements 40 of FIG. 2, or information could be conveyed away to a remote location for viewing or data processing. The use of the array allows many different locations within the bearing 42 to be monitored simultaneously, which readily allows for discrimination between different components, such as rolling elements within the bearing, to show whether one is more distressed than others, or to show whether one part of a particular element is more distressed than other parts of the same element.

Figure 6:
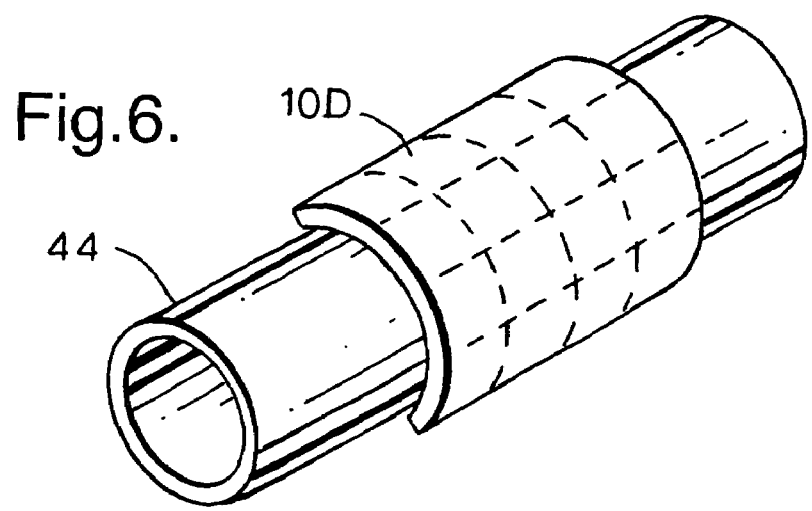

In all of the examples shown above, the sensor has been in the form of a generally planar array. However, non-planar arrays could be constructed, for a variety of purposes. In particular, it is envisaged that there may be advantages in forming non-planar arrays which substantially conform to the surface of a predetermined region of an object. FIG. 6 illustrates an example in which a circular pipe 44 is partially covered by a sensor 10D in the form of a part-cylindrical array of sensor elements. Details of the sensor elements, their outputs, and downstream, circuitry are not shown in FIG. 6, in the interests of clarity. It can readily be understood from the geometry of FIG. 6 that by providing a sensor 10D of appropriate cylindrical radius, the sensor 10D can be placed around the pipe 44 with each of the elements of the sensor 10D being spaced by substantially the same distance from the pipe 44. This will allow consistently comparable measurements to be made by each of the sensor elements, so that information relating to the electrostatic charge distribution across the region of the pipe 44 can be collected on a consistent basis.

Figure 7:
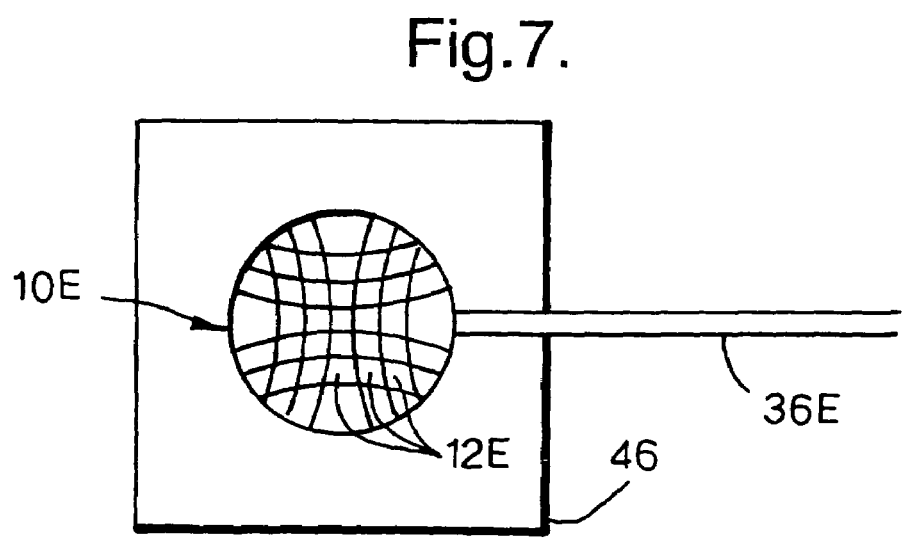

In the example of FIG. 6, the sensor elements would be positioned to sense inwardly of the curved surface of the sensor 10D. In an alternative, illustrated highly simplistically in FIG. 7, sensor elements could be arranged to look outwardly. In the arrangement of FIG. 7, the sensor 10E is of spherical or part-spherical form, formed by an array of sensor elements 12E, located to sense electrostatic charge outwardly of the sensor 10E. Thus, with the provision of an appropriate connection 36E for extracting data from the sensor 10E, the sensor 10E can be used within a cavity 46, for inspection of the interior of the cavity. A sensor of this type would yield a wide view similar to that from a fly's eye.

It will be apparent that many variations and modifications can be made to the apparatus described above, without departing from the scope of the present invention. In particular, many different geometries of sensor array could be envisaged, including changes to the size and spacing of sensor elements, and the shape of the sensor. All of these possibilities provide a non-contact measurement technique which allows multiple measurements to be taken simultaneously, and then allows an operator to visualise the electrostatic fields being sensed, rather than purely providing measurement data.

A wide range of applications can be envisaged for a sensor of the type described, including the following:

Medical Imaging

There is some evidence to suggest that electrostatic field measurements taken from the human body can be used for medical diagnosis. A sensor built in accordance with the present invention would allow a practitioner instantly to view an image of the electrostatic fields, and a hand-held device could readily be scanned across the body for exploratory diagnostic purposes. In addition to the possibility of measuring electrostatic charges at or below the skin, it is envisaged that electrostatic viewing of joints could be used to supplement x-ray imaging, thereby removing health problems associated with radiation, and may be of use in monitoring problems such as arthritis, or issues relating to artificial joints.

Geophysics

A sensor in accordance with the invention could be used within soil science and archaeology to provide measurements of the polar particle content of soil. This content will be affected by the condition and history of the soil. For example, disturbed soil will generally have greater interstitial volume than undisturbed soil and thus, is likely to have a greater ground water content. Images created with a sensor in accordance with the present invention could therefore be interpreted as indicating possible regions of disturbed soil, which could be of importance to archaeological research or various aspects of soil science. In addition, these arrangements may be able to detect items buried in the soil, if they are of a material which will create or maintain a charge state different to that of the soil within which the article is buried. The suitability of a sensor to any particular application, including its sensitivity and range, will depend on details of the sensor design and the electrostatic properties of the soil or article being measured.

Robotics

It is possible to envisage a sensor in accordance with the present invention being used to emulate sight in a robotic machine, "seeing" the electrostatic environment, rather than by means of light. This aspect of the invention could find application in situations in which machines must work in total or near darkness. For example, robotic handling of photographs materials may be facilitated.

Engineering

Contact stress or distress of engineering components can give rise to changes in electrostatic charge distribution, as indicated above in relation to FIG. 5. Thus, an image taken by means of a sensor of the invention may assist in identifying problems of this nature, or the consequences, such as wear or impending failure of a component. For example, railway wheels and tracks could be monitored for detection of skidding.

In many other situations, frettage can occur, such as between splines or gears. This will generate charges, such as a charge on the end of a spline, and an induced charge on the outside and inside of a spline pair. Within gears, the electrostatic charge distribution within the gears will be dependent on the distress state of the gears. In either event, an array of the invention allows this charge distribution to be measured and viewed, thus allowing points of distress to be identified, even while the gears are running.

A number of locations within internal combustion engines, gas turbine engines or other machines are vulnerable to frettage, wear and distress. Sensors of the invention can be used for non-contact measurement of these components to allow wear or impending wear or failure to be measured, viewed and predicted.

Debris Monitoring

A sensor array distributed around a pipe through which fluid and debris particles are flowing would allow measurements to be made of the speed of flow of the debris, the debris particle size and the total debris volume.

General

With appropriate data processing, it is envisaged that the output of sensors of the invention could be used for detection or counting of objects, such as objects on a conveyor belt or assembly line, or people passing a particular point.

Sensors could be used for scanning electrostatically sensitive areas, such as semi-conductor assembly rooms. Previous practice has used a single point detector to scan the area, in the event that unacceptable semi-conductor failure rates have arisen as a result of a suspected electrostatic source. A sensor of the invention could be installed to provide a continuous electrostatic image representing the area and thus allowing both the presence and location of an unwarranted electrostatic source to be readily determined.

Whilst endeavouring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

The invention claimed is:

1. A sensor comprising an array of electrostatic sensor elements, each capable of producing a respective output signal when the sensor is directed to a region of an object being sensed, the output signals being separately available at the sensor output to provide information relating to the electrostatic charge distribution across the region, the sensor further comprising a display means by means of which the output signals are displayed to provide an image having a plurality of pixels wherein the display intensity or display color of each pixel is determined by the magnitude or polarity of the charge sensed by the or a corresponding sensor element.

2. A sensor according to claim 1, wherein sensor elements are located at sensing positions defined by a substantially regular matrix of positions.

3. A sensor according to claim 1, wherein sensor elements are substantially contiguous across the array, to provide substantially continuous charge distribution information.

4. A sensor according to claim 1, wherein the sensor elements form a substantially planar array.

5. A sensor according to claim 1, wherein the sensor elements form a non-planar array.

6. A sensor according to claim 5, wherein the non-planar form of the array is substantially conforming to the surface of a predetermined region of an object.

7. A sensor according to claim 5, wherein the array is spherical or part-spherical, the sensor elements being arranged to sense outwardly of the sphere.

8. A sensor according to claim 1, wherein each sensor element incorporates a respective charge amplifier.

9. A sensor according to claim 1, wherein the output signals are displayed, in use, in a manner which allows each output signal to be separately identified.

10. A sensor according to claim 1, wherein each pixel displays in response to a respective output signal.

11. A sensor according to claim 1, wherein the display means has a greater number of pixels than there are sensor elements, and at least some pixel outputs are created with reference to a sensor element corresponding with a neighbouring pixel.

12. A sensor according to claim 1, wherein the pixels form an array laid out in the same manner as the corresponding sensor elements.

13. A sensor according to claim 1, wherein the display means and the array of elements are incorporated within a common structure.

14. A sensor according to claim 13, wherein each sensor element incorporates a display element which provides a pixel of the sensor display image.

15. A sensor according to claim 1, wherein the sensor is part of a portable hand-held device.

* * * * *